US012573818B2

(12) United States Patent
Terao et al.

(10) Patent No.: US 12,573,818 B2
(45) Date of Patent: Mar. 10, 2026

(54) VCSEL WITH PROTRUSION HAVING INCLINED SIDE WALLS FORMED IN P-SIDE SEMICONDUCTOR LAYER

(71) Applicant: NICHIA CORPORATION, Anan (JP)

(72) Inventors: Kenichi Terao, Tokushima (JP); Hitoshi Takayama, Tokushima (JP)

(73) Assignee: NICHIA CORPORATION, Anan (JP)

( * ) Notice: Subject to any disclaimer, the term of this patent is extended or adjusted under 35 U.S.C. 154(b) by 1018 days.

(21) Appl. No.: 17/381,901

(22) Filed: Jul. 21, 2021

(65) Prior Publication Data

US 2022/0029387 A1 Jan. 27, 2022

(30) Foreign Application Priority Data

Jul. 27, 2020 (JP) ................................. 2020-126795

(51) Int. Cl.
*H01S 5/183* (2006.01)
*H01S 5/0234* (2021.01)
(Continued)

(52) U.S. Cl.
CPC ........ *H01S 5/18308* (2013.01); *H01S 5/0421* (2013.01); *H01S 5/18341* (2013.01); *H01S 5/0234* (2021.01); *H01S 5/02469* (2013.01); *H01S 5/04253* (2019.08); *H01S 5/04256* (2019.08); *H01S 5/04257* (2019.08); (Continued)

(58) Field of Classification Search
CPC .............. H01S 5/18308; H01S 5/0421; H01S 5/18341; H01S 5/0234; H01S 5/02469;

H01S 5/04253; H01S 5/04256; H01S 5/04257; H01S 5/18305; H01S 5/18347; H01S 5/18369; H01S 5/34333

See application file for complete search history.

(56) References Cited

U.S. PATENT DOCUMENTS

2009/0159879 A1* 6/2009 Jeong ................. H10D 30/6755
257/E33.013
2010/0098127 A1* 4/2010 Higuchi .............. H01S 5/18341
257/E33.002
(Continued)

FOREIGN PATENT DOCUMENTS

JP 2011-029607 A 2/2011
JP 2013-084913 A 5/2013
(Continued)

*Primary Examiner* — M. A. Golub-Miller
(74) *Attorney, Agent, or Firm* — Spencer Fane LLP

(57) ABSTRACT

A vertical cavity surface emitting laser element includes a first light reflecting film, a nitride semiconductor layered body, a p-electrode and a second light reflecting film. The nitride semiconductor layered body includes an n-side semiconductor layer disposed on the first light reflecting film, an active layer disposed on the n-side semiconductor layer, and a p-side semiconductor layer disposed on the active layer. The p-side semiconductor layer includes a protrusion and a surface around the protrusion. The p-electrode is in contact with an upper surface of the protrusion, and extends to the surface around the protrusion. The p-electrode is light-transmissive. The second light reflecting film is disposed on the p-electrode. A height of the protrusion as measured from the surface around the protrusion is smaller than a thickness of the p-electrode.

17 Claims, 7 Drawing Sheets

(51) Int. Cl.
  *H01S 5/024*     (2006.01)
  *H01S 5/042*     (2006.01)
  *H01S 5/343*     (2006.01)

(52) U.S. Cl.
  CPC ....... *H01S 5/18305* (2013.01); *H01S 5/18347* (2013.01); *H01S 5/18369* (2013.01); *H01S 5/34333* (2013.01)

(56)       References Cited

U.S. PATENT DOCUMENTS

| | | | | |
|---|---|---|---|---|
| 2010/0289020 | A1* | 11/2010 | Yano .................. | H10D 30/6758 |
| | | | | 257/E29.296 |
| 2015/0043606 | A1 | 2/2015 | Hamaguchi et al. | |
| 2017/0033533 | A1* | 2/2017 | Hamaguchi ......... | H01S 5/18361 |
| 2017/0104315 | A1* | 4/2017 | Yeh .................... | H10H 20/8162 |
| 2017/0201073 | A1* | 7/2017 | Futagawa ........... | H01L 21/0254 |
| 2017/0256914 | A1 | 9/2017 | Hsu et al. | |
| 2018/0048119 | A1 | 2/2018 | Hsu et al. | |
| 2018/0226771 | A1 | 8/2018 | Tazawa et al. | |
| 2018/0358780 | A1 | 12/2018 | Hsu et al. | |
| 2018/0366906 | A1* | 12/2018 | Hamaguchi ............. | H01S 5/028 |
| 2019/0386189 | A1 | 12/2019 | Lee et al. | |
| 2021/0384706 | A1* | 12/2021 | Kuramoto ........... | H01S 5/18361 |
| 2023/0144914 | A1* | 5/2023 | Terao .................. | H01S 5/18361 |
| | | | | 372/99 |
| 2024/0146025 | A1* | 5/2024 | Terao .................. | H01S 5/04256 |

FOREIGN PATENT DOCUMENTS

| | | | |
|---|---|---|---|
| JP | 2015-035541 | A | 2/2015 |
| JP | 2017-163140 | A | 9/2017 |
| JP | 2018-129385 | A | 8/2018 |
| JP | 2020-504908 | A | 2/2020 |
| JP | 2020-064993 | A | 4/2020 |
| JP | 2020-064994 | A | 4/2020 |

* cited by examiner

VCSEL WITH PROTRUSION HAVING INCLINED SIDE WALLS FORMED IN P-SIDE SEMICONDUCTOR LAYER

CROSS-REFERENCE TO RELATED APPLICATION

This application claims priority to Japanese Patent Application No. 2020-126795 filed on Jul. 27, 2020, the entire contents of which are hereby incorporated herein by reference.

BACKGROUND

The present disclosure relates to a vertical cavity surface emitting laser element.

A laser element that functions as a vertical cavity surface emitting laser using a nitride semiconductor has been studied. For example, a structure has been proposed in which an insulating film is disposed on a semiconductor layered body to perform current confinement.

For example, JP 2015-035541 A describes a structure in which an insulating film defining an opening on a surface of a p-type semiconductor layer is disposed, and a transparent electrode such as an ITO electrode is disposed on a surface of the p-type semiconductor layer exposed from the opening. Further, JP 2018-129385 A describes a configuration in which a mesa structure is provided as a p-type semiconductor layer of a surface emitting laser element that contains a GaN-based semiconductor layered body, and the mesa structure is surrounded by an insulating film defining an opening.

SUMMARY

In a surface emitting laser element including a protrusion serving as a current confinement structure on a p-type semiconductor layer, a thickness of the electrode disposed on the protrusion varies due to the protrusion, so that, in particular, a thickness of a portion of an electrode on a lateral surface of the protrusion tends to be reduced. In contrast to an edge emitting laser element, in a vertical cavity surface emitting laser element, such a portion of an electrode extending over a lateral surface of the protrusion serves as a current path, and thus sheet resistance tends to increase when a current flows through such a thin film portion of the electrode. Further, due to undulation attributed to the protrusion, the electrode over the protrusion has a bent shape. Current concentration tends to occur at a portion where the electrode is bent, which may lead to the breakage of the electrode.

A vertical cavity surface emitting laser element according to one embodiment of the present invention includes a first light reflecting film, a nitride semiconductor layered body, a p-electrode and a second light reflecting film. The nitride semiconductor layered body includes an n-side semiconductor layer disposed on the first light reflecting film, an active layer disposed on the n-side semiconductor layer, and a p-side semiconductor layer disposed on the active layer. The p-side semiconductor layer includes a protrusion and a surface around the protrusion. The p-electrode is in contact with an upper surface of the protrusion, and extends to the surface around the protrusion. The p-electrode is light-transmissive. The second light reflecting film is disposed on the p-electrode. A height of the protrusion as measured from the surface around the protrusion is smaller than a thickness of the p-electrode.

According to a vertical cavity surface emitting laser element of the present disclosure, it is possible to improve lifespan characteristics for a vertical cavity surface emitting laser element including a protrusion on a p-side semiconductor layer side.

DETAILED DESCRIPTION

Figure 1A:
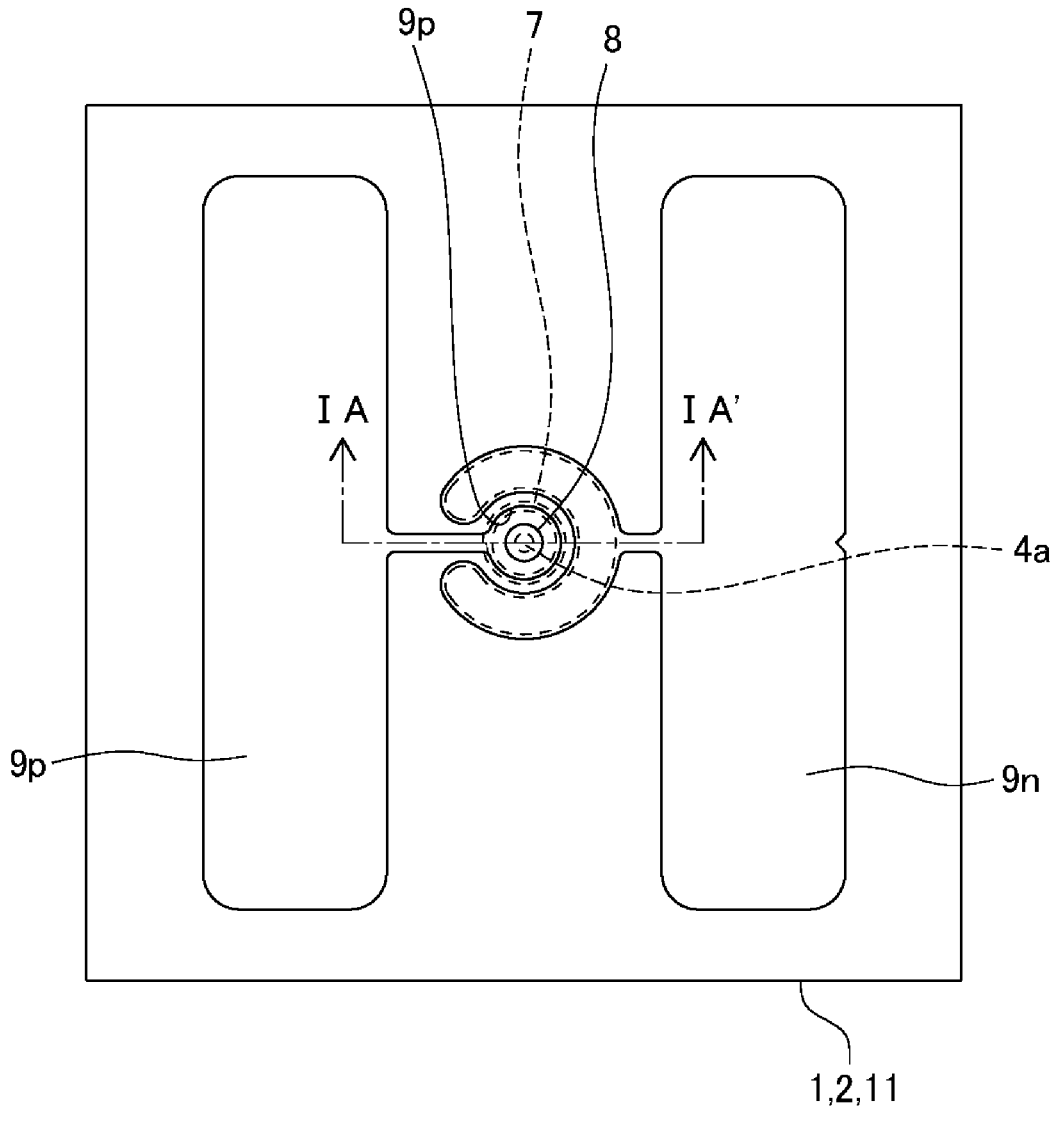
FIG. 1A is a schematic plan view for describing a structure of a vertical cavity surface emitting laser element according to one embodiment of the present invention.

Certain embodiments of the present disclosure will be described below with reference to the drawings as appropriate. The embodiments described below are merely intended to give a concrete form to the technical idea of the present disclosure, and the present disclosure is not limited to the description below unless otherwise specified. Further, the contents described in one embodiment and one example can be applied to another embodiment and another example. The size, thickness, positional relationship, or the like of members illustrated in the drawings may be exaggerated for clarity of description.

In the present specification, a direction from an n-side semiconductor layer toward a p-side semiconductor layer in a nitride semiconductor layered body in a vertical cavity surface emitting laser element is defined as a direction from a lower side toward an upper side.

Figure 1B:
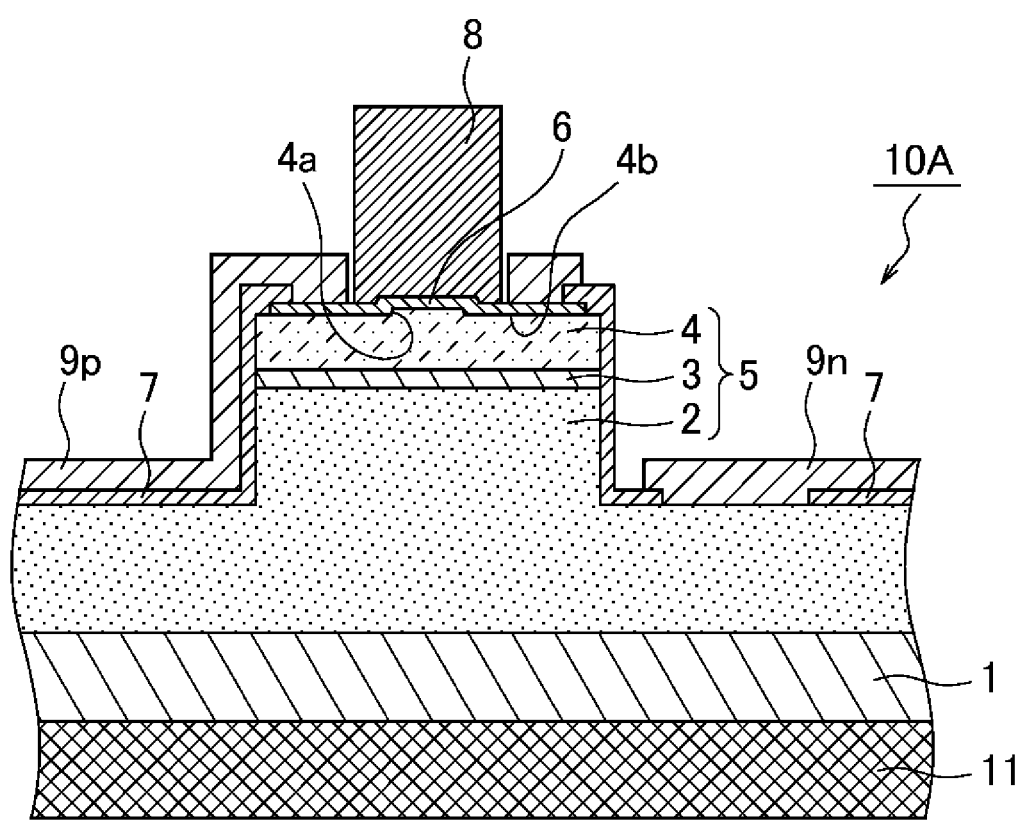
FIG. 1B is a schematic cross-sectional view taken along line IA-IA' in FIG. 1A.

As illustrated in FIGS. 1A and 1B, a vertical cavity surface emitting laser element according to one embodiment of the present disclosure includes a first light reflecting film 1, a nitride semiconductor layered body 5, a light-transmissive p-electrode 6, and a second light reflecting film 8. The nitride semiconductor layered body 5 is disposed on an upper surface of the first light reflecting film 1, and includes an n-side semiconductor layer 2, an active layer 3, and a p-side semiconductor layer 4 including a protrusion 4a. The n-side semiconductor layer 2, the active layer 3 and the p-side semiconductor layer 4 are layered in this order. The p-electrode 6 is disposed to be in contact with an upper surface of the protrusion 4a and extends to a surface 4b around the protrusion. The second light reflecting film 8 is disposed on the p-electrode 6.

In the vertical cavity surface emitting laser element including such a configuration, a height of the protrusion as measured from the surface around the protrusion is smaller than a thickness of the p-electrode. With this structure, partial reduction in thickness of the p-electrode due to the presence of the protrusion of the p-side semiconductor layer and thus current concentration in the p-electrode can be reduced, so that breakage of the p-electrode due to the current concentration can be prevented. Accordingly, lifespan characteristics can be improved. Instead of or in addition to such a relationship between the height of the protrusion and the thickness of the p-electrode, an angle of inclination of a lateral surface of the protrusion with respect to the surface around the protrusion can be set to be equal to or less than 60 degrees. With this structure, partial reduction in thickness of the p-electrode due to the presence of the protrusion of the p-side semiconductor layer and thus current concentration in the p-electrode can be reduced, so that breakage of the p-electrode due to the current concentration can be prevented. Accordingly, lifespan characteristics of the vertical cavity surface emitting laser element can be improved.

First Light Reflecting Film 1

The first light reflecting film 1 includes, for example, a semiconductor multilayer film and a dielectric multilayer film. The light reflecting film can be a layered film obtained by alternately layering two or more types of films having different refractive indices. Examples of the semiconductor multilayer film include a nitride semiconductor layer, for example, an AlInGaN compound semiconductor. Specific examples of the semiconductor multilayer film include AlN, InN, GaN, AlGaN, InGaN, AlInN, and AlInGaN. In particular, a combination of GaN and AlInN that lattice-matches with GaN is preferable. Further, examples of the dielectric multilayer film include an oxide, a nitride, a fluoride, or the like such as Si, Mg, Al, Hf, Nb, Zr, Sc, Ta, Ga, Zn, Y, B, and Ti. Specific examples of the dielectric multilayer film include $SiO_2/Nb_2O_5$, $SiO_2/Ta_2O_5$, and $SiO_2/Al_2O_3$.

In order to have intended reflectivity, the material, thickness, number of layers, and the like constituting each layer of the first light reflecting film 1 can be appropriately selected. For example, the thickness of each layer constituting a layered film may be $\lambda/(4n)$ (where $\lambda$ is an oscillation wavelength of laser, and n is a refractive index of a medium constituting each layer), and can be appropriately set according to the refractive index n of the material used in the oscillation wavelength $\lambda$. More specifically, it is preferable that the thickness of each layer is an odd number of times of $\lambda/(4n)$. For example, when the first light reflecting film 1 is formed of GaN/AlInN in a light emitting element having the oscillation wavelength $\lambda$ of 450 nm, a thickness of each layer is in a range of 40 nm to 70 nm. The number of layers constituting the layered film can be appropriately set according to an intended characteristic. The layered film can be constituted of two or more layers, and the number of the layers can be in a range of, for example, five layers to one-hundred layers. The entire thickness of the first light reflecting film 1 can be, for example, in a range of 0.08 μm to 7 μm.

The size and shape of the first light reflecting film 1 can be appropriately designed as long as the first light reflecting film 1 covers a light emitting portion of the laser element.

For example, as will be described below, the first light reflecting film 1 can be formed using a method known in the art on a substrate 11 for semiconductor growth or via an undercoat layer and the like on the substrate 11.

Layered Body 5 of Nitride Semiconductor

The nitride semiconductor layered body 5 is disposed on the first light reflecting film 1. For example, the nitride semiconductor layered body 5 includes, the n-side semiconductor layer 2 formed of an AlInGaN compound semiconductor, the active layer 3 formed of an AlInGaN compound semiconductor, and the p-side semiconductor layer 4 formed of an AlInGaN compound semiconductor that are layered in this order on the first light reflecting film 1. Examples of the AlInGaN compound semiconductor include AlN, InN, GaN, AlGaN, InGaN, AlInN, and AlInGaN.

The n-side semiconductor layer 2 is formed of a single layer or multiple layers, and includes one or more n-type layers doped with an n-type impurity such as Si. The active layer 3 has, for example, a layered structure in which a quantum well layer formed of InGaN and a barrier layer formed of GaN are alternately layered. The number of layers can be appropriately set according to a desired characteristic. Further, InGaN and the like having an In composition lower than that of InGaN of the quantum well layer can be used as the barrier layer in addition to GaN. The p-side semiconductor layer 4 can include a p-side cladding layer, and a p-side contact layer disposed on the p-side cladding layer. The p-side contact layer is a layer doped with a p-type impurity such as Mg. The p-side cladding layer can be a layer in which the p-type impurity is doped or undoped at a concentration lower than that of the p-side contact layer. In this case, the p-side contact layer is an uppermost layer of the p-side semiconductor layer 4.

A thickness of each of the n-side semiconductor layer 2, the active layer 3, and the p-side semiconductor layer 4 can be appropriately set. The entire thickness between the upper surface of the first light reflecting film 1 and a bottom surface of the second light reflecting film 8 as will be described below is an integer multiple of $\lambda/(2n)$, and is set so as to form a standing wave therebetween. Then, it is preferable in an arrangement that a portion having the strongest standing wave is located in the active layer 3 and a portion having the weakest standing wave is located in the light-transmissive p-electrode 6 as will be described below. With such a configuration, a threshold current can be reduced. The threshold current refers to a minimum current required for a laser oscillation.

Figure 1C:
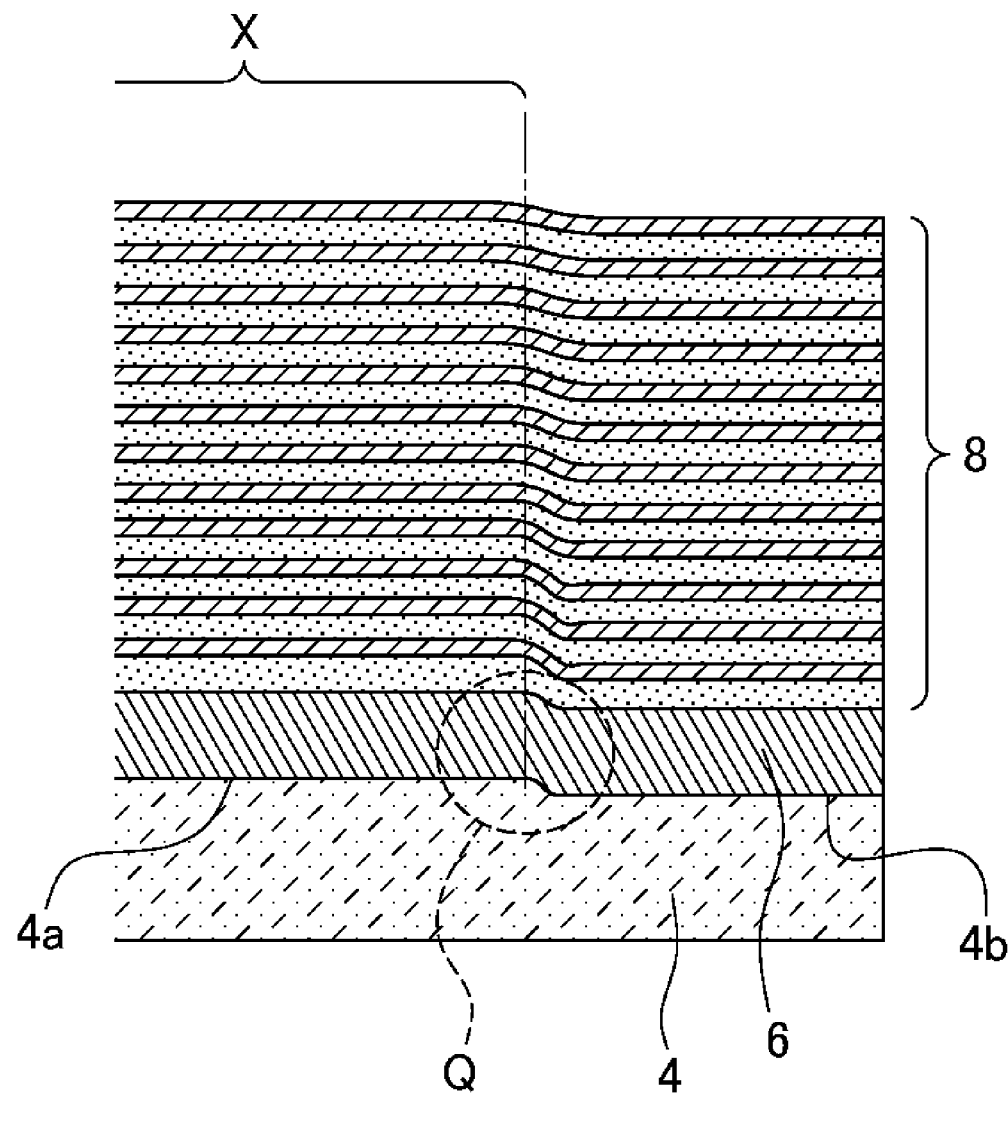
FIG. 1C is a schematic cross-sectional view of a relevant portion illustrating a layered structure in a current confinement structure of the vertical cavity surface emitting laser element in FIG. 1A.
Figure 1D:
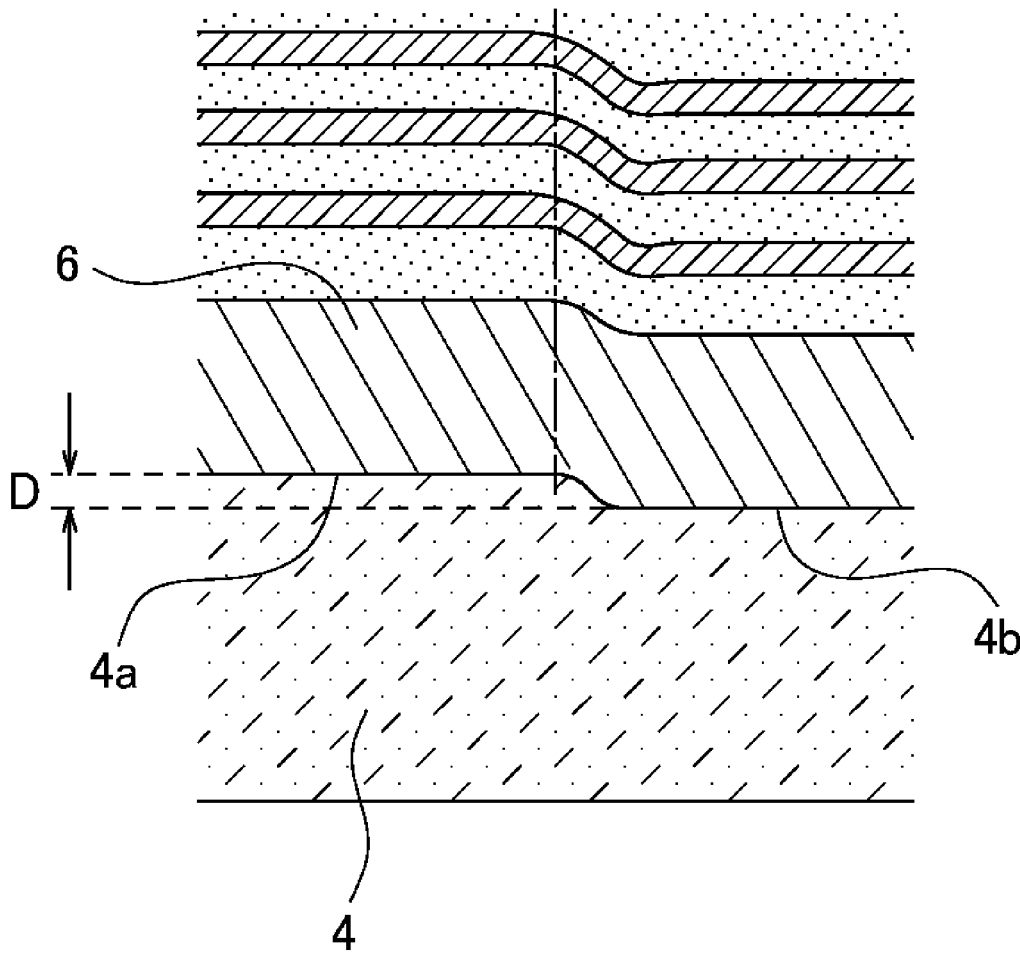
FIG. 1D is a partially enlarged cross-sectional view schematically showing a vicinity Q of a protrusion in FIG. 1C.
Figure 1E:
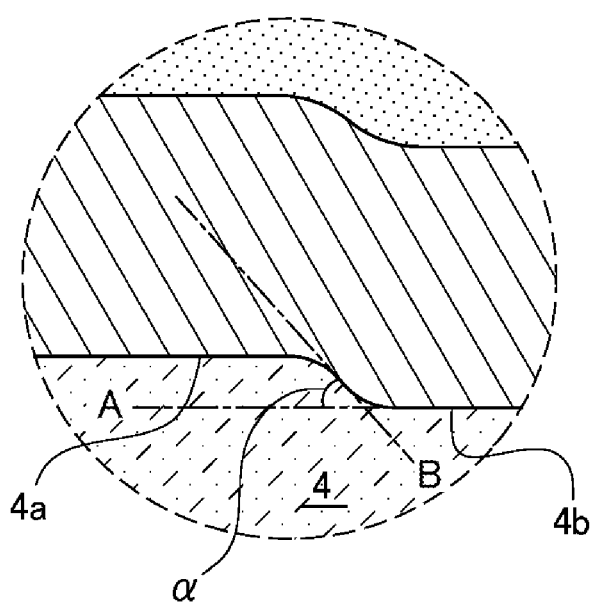
FIG. 1E is a schematic cross-sectional view in which the vicinity of the protrusion in FIG. 1D is further enlarged.

The nitride semiconductor layered body 5 includes the protrusion 4a on the upper surface of the p-side semiconductor layer 4. The protrusion 4a has a shape projecting upward. The upper surface of the protrusion 4a functions as a current injection region, and a region directly below the current injection region serves as the light emitting portion. Examples of a planar shape of the protrusion 4a include shapes such as a circular shape, an elliptic shape, and a polygonal shape, but a circular shape is preferable in consideration for injecting a more uniform current into the nitride semiconductor layered body 5. The upper surface of the protrusion 4a has a size, for example, with a diameter or one side having a length in a range of 2 μm to 12 μm. The lateral surface of the protrusion 4a may be perpendicular to the upper surface of the protrusion 4a, but it is preferable that the lateral surface is inclined as illustrated in FIGS. 1D and 1E. An angle of inclination (a in FIG. 1E) of the lateral surface of the protrusion 4a with respect to the surface 4b around the protrusion is equal to or less than 60 degrees, preferably equal to or less than 45 degrees, more preferably equal to or less than 40 degrees, and even more preferably equal to or less than 30 degrees. Further, the angle of inclination a may be greater than zero degree, greater than or equal to one degree, and greater than or equal to five degrees. As illustrated in FIG. 1E, the angle of inclination a is an angle of the lateral surface of the protrusion 4a with respect to a plane flush with the surface 4b around the protrusion. In the cross-sectional view in FIG. 1E, the plane flush with the surface 4b around the protrusion is indicated by a single virtual straight line (hereinafter referred to as "virtual straight line A"). When a connection portion between the surface 4b around the protrusion and the protrusion 4a is a curved surface, as illustrated in FIG. 1E, the lateral surface of the protrusion 4a is represented by a single virtual straight line (hereinafter referred to as "virtual straight line B") in a cross-sectional view, and an angle of the virtual straight line B with respect to the virtual straight line A is determined as the angle of inclination a. In FIG. 1E, of two types of angles formed by the virtual line A and the virtual line B, the angle of inclination a of the protrusion 4a is an angle formed by the virtual line A and a portion of the virtual line B extending upward from an intersection of the virtual line A and the virtual line B. As illustrated in FIG. 1B etc., the "surface 4b around the protrusion" as used here refers to a flat surface of the flat p-side semiconductor layer 4 around the protrusion 4a. Further, the protrusion 4a preferably has a frustum shape, for example. The protrusion 4a is inclined at an angle within the range described above, and thus the reduction in thickness of the p-electrode 6 described later can be further reduced. In addition, an undulation of the p-electrode 6 near the protrusion 4a can be gentle, so that the current concentration at a bent portion of the p-electrode 6 around the protrusion 4a can be reduced. Thus, the light emitting portion can be defined by forming the protrusion 4a in the upper surface of the p-side semiconductor layer 4. Further, the formation of the protrusion 4a allows for having a difference in refractive index between a resonator portion and a periphery thereof, which allows lateral light confinement.

A height (D in FIG. 1D) of the protrusions 4a is, for example, equal to or less than 100 nm or equal to or less than 50 nm.

In particular, it is preferable that the height is smaller than a thickness of the p-electrode 6 to be described below. The height D of the protrusion 4a is preferably equal to or less than 0.8 times the thickness of the p-electrode, more preferably equal to or less than 0.5 times, and even more preferably equal to or less than 0.3 times. Further, the height D of the protrusion 4a may be greater than or equal to 0.05 times the thickness of the p-electrode 6. With the height D of the protrusion 4a smaller than the thickness of the p-electrode 6, a variation in thickness of the p-electrode 6 due to the presence of the protrusion can be reduced, with regard to the p-electrode 6, which will be described below, disposed on the protrusion 4a. This allows for reducing partial reduction in thickness. Further, this also allows for facilitating securing the shortest current path in the p-electrode 6 around the protrusion 4a, which can reduce the current concentration to the p-electrode 6 in the bent portion. Accordingly, the breakage of the p-electrode 6 can be reduced, and lifespan characteristics of the vertical cavity surface emitting laser element can be improved. Further, as illustrated in FIG. 1C, the second light reflecting film 8, which will be described below, formed on the protrusion 4a can be disposed to be more flat on the upper surface of the protrusion 4a, i.e., directly above a current injection region X. With this structure, a carrier can be effectively injected into the light emitting portion. This allows for generating laser light more stably in the light emitting portion. The term "height D of the protrusion 4a" as used herein refers to the shortest distance between the flat plane extending from the surface 4b around the protrusion toward the center of the protrusion 4a and the upper surface of the protrusion 4a, for example, as illustrated in FIG. 1D.

Further, the height D of the protrusion 4a is preferably equal to or less than 30 nm, more preferably equal to or less than 20 nm, and even more preferably equal to or less than 15 nm. With the height D equal to or less than 30 nm, a scattering loss of light at the surface of the protrusion 4a can be reduced, and a threshold current of the vertical cavity surface emitting laser element can be reduced. Further, the height D of the protrusion 4a is preferably set to a height greater than or equal to 1 nm or greater than or equal to 3 nm. With the height D greater than or equal to 1 nm, current confinement can be more easily performed.

It is preferable that the upper surface of the protrusion 4a of the p-side semiconductor layer 4 is formed of (defined by) a p-side contact layer in which the p-type impurity is doped at the highest concentration among the p-side semiconductor layer 4. The entirety of the protrusion 4a may be formed only of (defined only by) the p-side contact layer, but it is preferable that the protrusion 4a includes a layer that is doped with the p-type impurity at a concentration lower than that of the p-side contact layer or undoped. It is preferable that such a low-concentration doped or undoped layer is disposed in the surface 4b around the protrusion. In this case, the low-concentration doped or undoped layer is also disposed in a lower portion of the protrusion 4a. Such a low-concentration doped or undoped layer is disposed as, for example, the p-side cladding layer. In other words, it is preferable that a p-type impurity concentration of the layer constituting the upper surface of the protrusion 4a is higher than a p-type impurity concentration of the surface 4b around the protrusion. With this structure, the upper surface of the protrusion 4a can be in good contact with the light-transmissive p-electrode 6. Further, even when the surface 4b around the protrusion contacts the p-electrode 6, a current injected into the contacting portion can be smaller than that into the protrusion 4a. Therefore, a current can be efficiently injected from substantially only the upper surface of the protrusion 4a. The p-type impurity concentration of the layer constituting the surface 4b around the protrusion can be in a range of, for example, $1 \times 10^{17}$ cm$^{-3}$ to $1 \times 10^{19}$ cm$^{-3}$. Further, the p-type impurity concentration of the layer constituting the upper surface of the protrusion 4a can be in a range of, for example, $5 \times 10^{19}$ cm$^{-3}$ to $5 \times 10^{21}$ cm$^{-3}$.

In order to form the second light reflecting film 8 to be flat as will be described below, it is preferable that the upper surface of the protrusion 4a is a flat surface. Further, it is preferable that the surface 4b around the protrusion of the p-side semiconductor layer 4 is also a flat surface. The expression "the upper surface of the protrusion 4a is flat" means that, for example, arithmetic average roughness of the upper surface of the protrusion 4a is in a range of 0.1 nm to 2 nm. Further, the expression that "the surface 4b around the protrusion is flat" means that, for example, the arithmetic average roughness of the surface 4b around the protrusion is in a range of 0.1 nm to 2 nm.

Examples of current confinement include an example in which the upper surface of the protrusion 4a is formed of the p-side contact layer in which the p-type impurity is doped at a high concentration, and the surface 4b around the protrusion is formed of the layer in which the p-type impurity is doped at a low concentration, as described above. With such a configuration, a current is preferentially injected from the p-side contact layer, and current confinement can be achieved without providing an insulating film between the p-electrode 6 and the p-side semiconductor layer 4, that is, while the surface 4b around the protrusion is flat.

As illustrated in FIG. 1B, it is preferable that a portion of the p-side semiconductor layer 4, the active layer 3, and the n-side semiconductor layer 2 in the nitride semiconductor layered body 5 is removed in a thickness direction on the surface 4*b* around the protrusion, i.e., on the p-side semiconductor layer 4 side, and the n-side semiconductor layer 2 is partially exposed. In other words, it is preferable that the n-side semiconductor layer 2 is exposed on a side the upper surface of the nitride semiconductor layered body 5 in the n-side semiconductor layer 2, i.e., in a portion on the p-side semiconductor layer 4 side. With this structure, the p-electrode and the n-electrode that supply a current to the laser element can be disposed on the same surface side of the layered body.

After the nitride semiconductor layered body 5 is formed, the protrusion 4*a* can be formed and a part of the n-side semiconductor layer 2 can be exposed by using a known method such as photolithography and etching.

p-Electrode 6

The p-electrode 6 is an electrode for injecting a current through the protrusion 4*a* of the p-side semiconductor layer 4, and is in contact with at least the upper surface of the protrusion 4*a*. The p-electrode 6 extends to the lateral surface of the protrusion 4*a*, and may extend to the surface 4*b* around the protrusion. For example, the p-electrode 6 is disposed on portions of the p-side semiconductor layer 4 from the upper surface of the protrusion 4*a* through the lateral surfaces of the protrusion 4*a* to a portion of the p-side semiconductor layer 4 around the protrusion 4*a*.

It is preferable that the p-electrode 6 contacts only the p-side semiconductor layer 4, and more preferably contacts the flat p-side semiconductor layer 4, particularly around the protrusion 4*a*. Further, a planar area of the upper surface of the p-electrode 6 can be, for example, larger than a planar area of the upper surface of the protrusion 4*a*, and can have a size such that an outer edge of the upper surface of the p-electrode 6 is located inward of the outer edge of the upper surface of the p-side semiconductor layer 4 in a plan view. This structure allows for facilitating the formation of a p-pad electrode 9*p* without overlapping the second light reflecting film 8 in a plan view.

The p-electrode 6 is a conductive member formed of a light-transmissive material having transmittance to light of a peak wavelength of oscillating laser light of the vertical cavity surface emitting laser element of greater than or equal to 60%, and more preferably greater than or equal to 90%. Examples of the light-transmissive material include a transparent conductive material that has, as a base material, an oxide such as indium-tin oxide (ITO) and indium-zinc oxide (IZO). More specifically, examples of the light-transmissive material include ITO. When the p-electrode 6 has a small thickness, light absorption by the p-electrode 6 can be reduced, but a resistance of the p-electrode 6 may be increased. Thus, the thickness of the p-electrode 6 can be appropriately adjusted in consideration of the balance between these.

A thickness of the p-electrode 6 is, for example, equal to or less than 100 nm, preferably equal to or less than 60 nm, more preferably equal to or less than 35 nm, and even more preferably equal to or less than 30 nm. Further, a thickness of the p-electrode 6 may be greater than or equal to 5 nm. The p-electrode 6 has a thickness in a range of, for example, 5 nm to 100 nm, preferably in a range of 10 nm to 60 nm, more preferably in a range of 15 nm to 35 nm, and even more preferably in a range of 20 nm to 30 nm. When a thickness of the p-electrode 6 is within the range described above, absorption of light into the p-electrode 6 can be reduced and a threshold current can be reduced.

A difference between a thickness of the p-electrode 6 and a height of the protrusion 4*a* can be, for example, greater than or equal to 10 nm, and preferably greater than or equal to 20 nm. This allows for further reducing current concentration at the bent portion of the p-electrode 6 around the protrusion 4*a*. The difference between a thickness of the p-electrode 6 and a height of the protrusion 4*a* is equal to or less than 100 nm.

A thickness of the p-electrode 6 may be greater than or equal to 1.25 times a height of the protrusion 4*a*, preferably greater than or equal to two times, and more preferably greater than or equal to three times. With such a thickness, the current concentration at the bent portion of the p-electrode 6 around the protrusion 4*a* can be further reduced. A thickness of the p-electrode 6 may be equal to or less than twenty times a height of the protrusion 4*a*.

Second Light Reflecting Film 8

The second light reflecting film 8 is disposed on the p-electrode 6. The second light reflecting film 8 may be disposed only on the upper surface of the protrusion 4*a*, or may be disposed to extend from the upper surface of the protrusion 4*a* toward a lateral side of the protrusion 4*a*, i.e., also on at least a portion of the surface 4*b* around the protrusion 4*a*. In particular, when the second light reflecting film 8 is also disposed on the surface 4*b* around the protrusion, it is preferable that the surface 4*b* around the protrusion is flat. With such an arrangement, the second light reflecting film 8 can be formed to be flat directly above or directly above and around the current injection region. Therefore, the second light reflecting film 8 is not affected by irregularities of an undercoat, and reflectivity can be uniform in a relatively wide range of a region of the dielectric multilayer film. Thus, control can be easily performed in order to stabilize a shape of the oscillating laser light.

The term "at least a portion of the surface 4*b* around the protrusion" refers to, for example, a region surrounding the protrusion 4*a*, and having a diameter or one side having a length greater than a length of a diameter or one side of the protrusion 4*a* by a range of approximately 10% to 50%. While it is preferable that an area of the upper surface of the protrusion 4*a* is small to obtain current confinement, it is easy to form the second light reflecting film 8 when a planar area of the second light reflecting film 8 is large to some extent. Thus, it is preferable that the second light reflecting film 8 is provided not only on the upper surface of the protrusion 4*a*, but also in the region including at least a portion of the surface 4*b* around the protrusion.

The second light reflecting film 8 can include the dielectric multilayer film. The second light reflecting film 8 can have a configuration similar to the dielectric multilayer film illustrated above as an example of the first light reflecting film 1. For example, examples of the dielectric multilayer film include $SiO_2/Nb_2O_5$, $SiO_2/Ta_2O_5$, and $SiO_2/Al_2O_3$. It is preferable that a thickness of each layer is $\lambda/(4n)$ (where $\lambda$ is an oscillation wavelength of the laser, and n is a refractive index of a medium constituting each layer). The number of layers can be appropriately set according to an intended characteristic. More specifically, when the second light reflecting film 8 is formed of $SiO_2/Nb_2O_5$ and the like, a thickness of each layer is in a range of 40 nm to 70 nm. The number of layers in such a layered film is two or greater, and can be in a range of, for example, five to twenty. The entire thickness of the second light reflecting film 8 is in a range of, for example, 0.08 μm to 2.0 μm, and can be in a range of 0.6 μm to 1.7 μm.

It is preferable that the second light reflecting film 8 is spaced apart from an insulating film 7 described below. In other words, it is preferable that the second light reflecting film 8 is disposed without overlapping the insulating film 7 described below in a plan view. With such a structure, the second light reflecting film 8 including fewer steps can be disposed.

Other Members

Insulating Film 7

A vertical cavity surface emitting laser element 10A may further include the insulating film 7.

It is preferable that the insulating film 7 is spaced apart from the upper surface of the protrusion 4*a*. With such a structure, the p-electrode 6 including fewer steps can be formed. In addition, the second light reflecting film 8 including fewer steps can be disposed. Further, it is preferable that the insulating film 7 covers at least a portion of the surface 4*b* around the protrusion 4*a* of the p-side semiconductor layer 4. In other words, the insulating film 7 is formed on at least the upper surface of the nitride semiconductor layered body 5 without overlapping the protrusion 4*a* so as to define an opening in the protrusion 4*a*, or the protrusion 4*a* and around the protrusion 4*a* in a plan view. With this structure, current injection from portions other than the protrusion 4*a* can be reduced. Further, the insulating film 7 may be disposed on portions or the whole of the lateral surfaces of the nitride semiconductor, or may be disposed further on a portion of the exposed upper surface of the n-side semiconductor layer 2. A thickness of the insulating film 7 can be appropriately set.

It is preferable that the insulating film 7 is spaced apart from the second light reflecting film 8. In other words, it is preferable that the insulating film 7 and the second light reflecting film 8 are disposed without overlapping each other in a plan view. With this structure, the second light reflecting film 8 can be more flatly disposed directly above the upper surface of the protrusion 4*a*.

The insulating film 7 can be formed of a $SiO_X$-based material including $SiO_2$, a $SiN_Y$-based material such as SiN, a $SiO_XN_Y$-based material, an inorganic material such as $Ta_2O_5$, $ZrO_2$, AlN, $Al_2O_3$, and $Ga_2O_3$.

p-Pad Electrode 9*p* and n-Electrode 9*n*

It is preferable that the vertical cavity surface emitting laser element 10A further includes the p-pad electrode 9*p* electrically connected to the p-electrode 6 on the lateral side of the protrusion 4*a*. Further, it is preferable to include an n-electrode 9*n* electrically connected to the exposed n-side semiconductor layer 2. With such a configuration, it is not necessary to pass through the first light reflecting film 1 as a current path, and thus it is not necessary to dope the first light reflecting film 1 with the n-type impurity, and the first light reflecting film 1 can reflect light at higher reflectivity.

The p-pad electrode 9*p* and the n-electrode 9*n* may be formed of any conductive material generally used for an electrode in the art. Examples of the conductive material include Ti/Pt/Au and Ti/Rh/Au. It is preferable that the p-pad electrode 9*p* is disposed in a shape surrounding the periphery of the protrusion 4*a*. With such a shape, a current can be more uniformly injected from the p-pad electrode 9*p* into the p-side semiconductor layer 4 through the p-electrode 6. Further, it is preferable that the p-pad electrode 9*p* is spaced apart from the second light reflecting film 8. In other words, it is preferable that the p-pad electrode 9*p* is disposed not to overlap the second light reflecting film 8 in a plan view. Thus, the p-pad electrode 9*p* is not disposed directly below the second light reflecting film 8, allowing for facilitating the second light reflecting film 8 directly above the current injection region to be flatter.

The n-electrode 9*n* and the p-pad electrode 9*p* may be formed of a single layer structure of the same material or different materials, may be formed of the same layered structure of the same material, or may be formed of different layered structures of different materials. When the n-electrode 9*n* and the p-pad electrode 9*p* are formed of the same layered structure of the same material, the n-electrode 9*n* and the p-pad electrode 9*p* can be formed in the same step.

Substrate 11

The nitride semiconductor layered body 5 is generally layered on a substrate for a semiconductor growth, and thus the vertical cavity surface emitting laser element may include a substrate 11 for the semiconductor growth. When the first light reflecting film 1 is formed of a nitride semiconductor, the first light reflecting film 1 is formed on the substrate 11, and then the nitride semiconductor layered body 5 is formed on the first light reflecting film 1. Alternatively, after the nitride semiconductor layered body 5 is formed on the substrate 11, the substrate for the semiconductor growth may be removed from the nitride semiconductor layered body 5, and the first light reflecting film 1 may be formed on a surface of the nitride semiconductor layered body 5 exposed by the removal. Examples of the substrate 11 for the semiconductor growth include a substrate of a nitride semiconductor (GaN and the like), sapphire, SiC, Si, or the like.

Heat Dissipation Substrate 12

Figure 2:
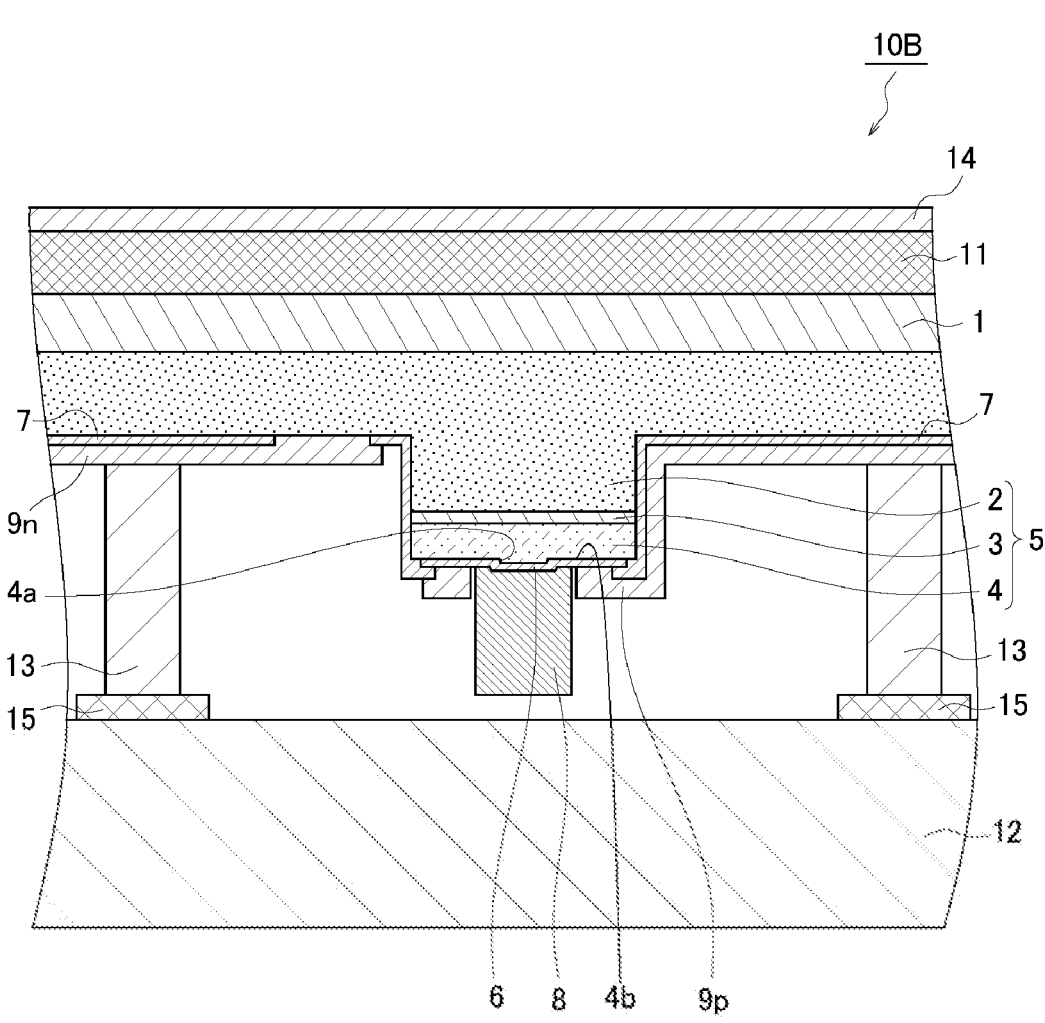
FIG. 2 is a schematic cross-sectional view of a relevant portion illustrating a modified example of the vertical cavity surface emitting laser element.

As illustrated in FIG. 2, the vertical cavity surface emitting laser element described above may be a vertical cavity surface emitting laser element 10B joined to a heat dissipation substrate 12. Examples of the heat dissipation substrate 12 include ceramic such as AlN, a semiconductor substrate formed of a semiconductor such as SiC, a metal substrate formed of a single metal material or a composite of two or more metal materials, and the like. For example, a substrate that contains insulating AlN ceramic as a base material and a plurality of metal films 15 disposed on the surface thereof can be used as the heat dissipation substrate 12. The metal film 15 is electrically connected to each of the p-pad electrode 9*p* and the n-electrode 9*n*. When it is not necessary to electrically connect both of the p-electrode and the n-electrode to the heat dissipation substrate 12, such as when the p-pad electrode 9*p* and the n-electrode 9*n* are disposed with the nitride semiconductor layered body 5 disposed therebetween or when the first light reflecting film 1 side is joined to the heat dissipation substrate 12, a conductive substrate such as a metal substrate may be used as the heat dissipation substrate 12. A thickness of the heat dissipation substrate 12 is in a range of approximately 50 μm to 500 μm, for example.

A method generally used in this field can be used for a method of forming the heat dissipation substrate 12.

Antireflective Film 14

While the vertical cavity surface emitting laser element 10B described above emits laser light from the first light reflecting film 1 side, an antireflective film 14 may be disposed on a surface of the first light reflecting film 1 at a side opposite to the nitride semiconductor layered body 5, or on a surface of the substrate 11 at the side opposite to the nitride semiconductor layered body 5 when including the substrate 11 described above. For the antireflective film 14, a material similar to that of the dielectric multilayer film illustrated in the first light reflecting film 1 described above can be used. By setting the number of layers and thickness of each layer different from those of the light reflecting film, the film having an antireflective function can be formed. Examples of a material of the antireflective film 14 include $SiO_2/Nb_2O_5$, $SiO_2/Ta_2O_5$, and $SiO_2/Al_2O_3$. Each layer of the antireflective film 14 can have a thickness of, for example, 0.4 μm.

Method for Manufacturing Vertical Cavity Surface Emitting Laser Element

The vertical cavity surface emitting laser element described above can be manufactured as follows. For example, the nitride semiconductor layered body 5 is formed including, in sequence, the n-side semiconductor layer 2, the active layer 3, and the p-side semiconductor layer 4 including the protrusion 4a. The light-transmissive p-electrode 6 is formed to be in contact with the upper surface of the protrusion 4a and to extend to the surface 4b around the protrusion. The second light reflecting film 8 is formed on the p-electrode 6. The protrusion 4a is formed by removing a portion of the upper surface of the p-side semiconductor layer 4. The p-electrode 6 is formed such that a height of the protrusion 4a is smaller than a thickness of the p-electrode 6. Further, in the method described above, instead of forming the p-electrode 6 such that a height of the protrusion 4a is smaller than a thickness of the p-electrode 6, the protrusion 4a may be formed such that the angle of inclination a of a lateral surface of the protrusion 4a is equal to or less than 45 degrees. Alternatively, the p-electrode 6 may be formed such that a height of the protrusion 4a is smaller than a thickness of the p-electrode 6 and such that the angle of inclination a of a lateral surface of the protrusion 4a is equal to or less than 45 degrees. The first light reflecting film 1 is formed, for example, before the nitride semiconductor layered body 5 is formed. In other words, the substrate 11 for the semiconductor growth may be provided, and the first light reflecting film 1 may be formed on the substrate 11. Subsequently, the n-side semiconductor layer 2, the active layer 3, and the p-side semiconductor layer 4 are layered in this order on the upper surface of the first light reflecting film 1. Furthermore, the protrusion 4a is formed by removing a part of the upper surface of the p-side semiconductor layer 4. In this manner, the nitride semiconductor layered body 5 can be formed. The protrusion 4a can be formed by removing a portion of the p-side semiconductor layer using, for example, dry etching and the like such that the protrusion 4a partially remains. When the nitride semiconductor layered body 5 is formed, a surface of the n-side semiconductor layer 2 may be exposed by removing a portion of the p-side semiconductor layer 4 and the active layer 3 before and after the protrusion 4a is formed. Subsequently, the light-transmissive p-electrode 6 that contacts the upper surface of the protrusion 4a and extends to the surface 4b around the protrusion is formed.

Subsequently, the insulating film 7 may be formed to cover a lateral side of the protrusion 4a and other portions of the p-side semiconductor layer 4. The insulating film 7 may be formed to partially cover the p-electrode 6, for example, so as to cover the periphery of the p-electrode 6.

After the insulating film 7 is formed, the p-pad electrode 9p and the n-electrode 9n are formed. When the p-pad electrode 9p is formed in a ring shape that is larger than the protrusion 4a and surrounds the upper surface and the periphery of the protrusion 4a, a current can be uniformly injected from the p-pad electrode 9p into the p-side semiconductor layer 4 through the p-electrode 6.

The second light reflecting film 8 is formed on the p-electrode 6, and formed on at least a portion of the surface 4b around the protrusion from the upper surface of the protrusion 4a. It is preferable that the second light reflecting film 8 is disposed to be spaced apart from the insulating film 7 and not to be in contact with the insulating film 7.

Subsequently, as illustrated in FIG. 2, the substrate for the semiconductor growth is thinned from a surface of the substrate for the semiconductor growth at a side opposite to the first light reflecting film 1, so that a thinned substrate can be obtained. At this time, the substrate for the semiconductor growth may be completely removed. The thinning or the removal can be performed by using a polishing method, an etching method, or the like known in this field. The antireflective film 14 may be formed on the surface of the substrate at the side opposite to the first light reflecting film 1. When the substrate 11 is completely removed, the antireflective film 14 may be formed on the surface of the first light reflecting film 1.

Furthermore, the obtained layered body 5 can be joined to the heat dissipation substrate 12. A joining layer 13 can be disposed to be joined to each of the p-pad electrode 9p and the n-electrode 9n at respective locations and to be joined to the metal film 15 of the heat dissipation substrate 12. The region between the heat dissipation substrate 12 and the obtained layered body 5, i.e., a region above the nitride semiconductor layered body 5 other than a region in which the joining layer 13 is disposed, may remain hollow, or may be filled with an insulating heat dissipation member and the like. The joining of the nitride semiconductor layered body 5 to the heat dissipation substrate 12 may be performed before the thinning and the like of the substrate 11 and/or the formation of the antireflective film 14. Further, the formation of the first light reflecting film 1 may be performed after the formation of the second light reflecting film 8. For example, a portion or the whole of the substrate 11 can be removed, and the first light reflecting film 1 can be formed on the surface exposed by the removal.

First Test Example

As illustrated in FIGS. 1A and 1B, as the vertical cavity surface emitting laser element 10A, the laser element including a substrate 11 formed of GaN, a layered body 5 of a nitride semiconductor, a light-transmissive p-electrode 6 (30 nm thickness) formed of ITO, a second light reflecting film 8 ($SiO_2$/$Nb_2O_5$, 76.9 nm/47.8 nm thickness, 15.5 pair) including a dielectric layered film, and an insulating film 7 (Sift, 100 nm thickness) was formed. In the nitride semiconductor layered body 5, a first light reflecting film 1 (AlInN/GaN, 51.2 nm/46.6 nm thickness, 50 pair), a n-side semiconductor layer 2 (Si-doped GaN), an active layer 3 (GaN/InGaN), and a p-side semiconductor layer 4 (undoped GaN and Mg-doped AlGaN and Mg-doped GaN) were layered in this order. The p-side semiconductor layer 4 included the protrusion 4a (angle of inclination: 27 degrees, height: 8 nm, diameter: 5 and planar shape: circular). The p-electrode 6 was in contact with the upper surface of the protrusion 4a, and extended to the surface 4b around the protrusion. The second light reflecting film 8 was disposed on the p-electrode 6 to be extended to the lateral side of the protrusion 4a. The insulating film 7 was spaced apart from the second light reflecting film 8, and covered at least a portion of the surface 4b around the protrusion of the p-side semiconductor layer 4. In a portion of the nitride semiconductor layered body 5, the p-side semiconductor layer 4 and the active layer 3 were removed to expose the n-side semiconductor layer 2, and the n-electrode 9n and the p-pad electrode 9p (Ti/Pt/Au, 1.5 nm/200 nm/500 nm) were disposed on a surface of the n-side semiconductor layer 2 and the p-electrode 6.

When the vertical cavity surface emitting laser element 10A having such a configuration was continuously operated by injecting a current (4 mA) at room temperature, laser light with a peak wavelength of 443 nm was emitted in the downward direction in FIG. 1B.

Further, the vertical cavity surface emitting laser element 10A was continuously operated by injecting a current (4

Figure 3:
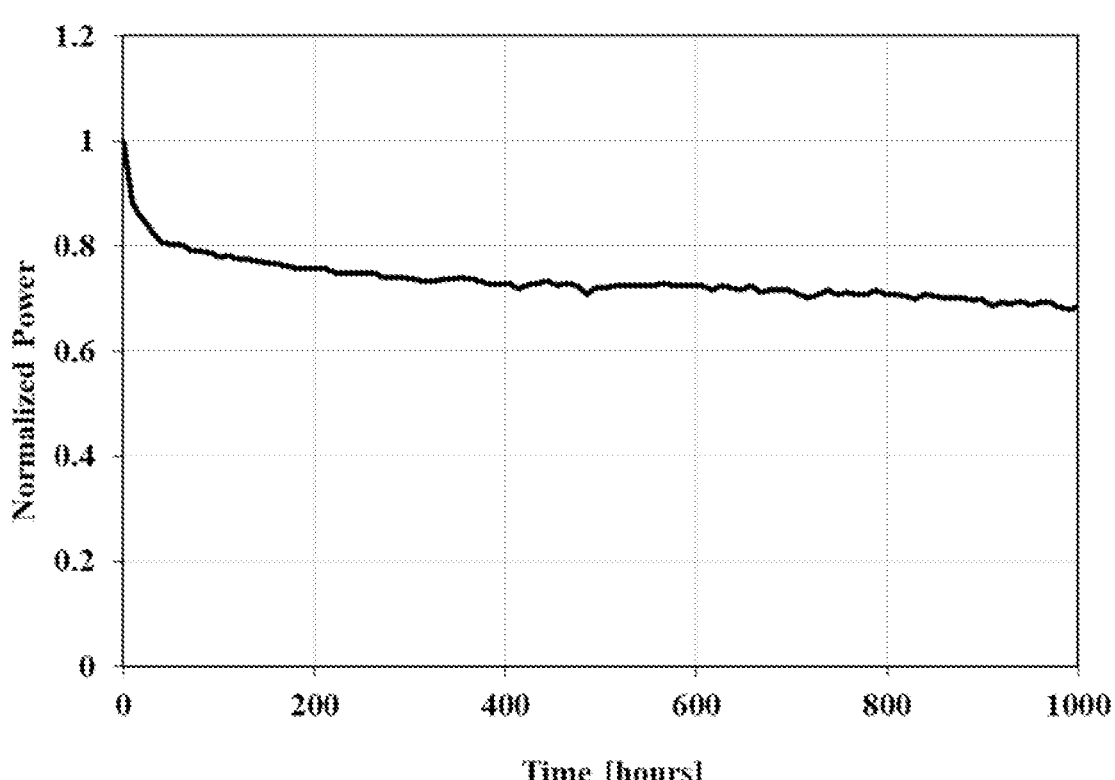
FIG. 3 is a graph illustrating change over time of a standardized light output when a vertical cavity surface emitting laser element of a test example 1 is caused to continuously oscillate.

13 mA) at room temperature, and a lifespan test was performed on an aging apparatus. Lifespan characteristics resulting from the lifespan test is illustrated in FIG. 3. The term "lifespan characteristic" in the present disclosure refers to a degree to which the laser element maintains light emission intensity when the laser element is continuously operated by injecting a constant current into the laser element in this manner. It can be understood from the result in FIG. 3 that, even 1000 hours after start of the operation, the vertical cavity surface emitting laser element 10A maintained an output close to 70% with respect to an initial output at the start of the operation. Further, a laser oscillation was confirmed even after driving for 1000 hours.

While certain embodiments of the present invention have been described above, the present invention is not limited the description above, and should be broadly construed on the basis of the claims. The present invention also encompasses variations and modifications that are made on the basis of the description above.

What is claimed is:

1. A vertical cavity surface emitting laser element, comprising:
a first light reflecting film;
a nitride semiconductor layered body including
an n-side semiconductor layer disposed on or above the first light reflecting film,
an active layer disposed on or above the n-side semiconductor layer, and
a p-side semiconductor layer disposed on or above the active layer, the p-side semiconductor layer including
a protrusion and
a surface around the protrusion;
a p-electrode in contact with an upper surface of the protrusion, and extending to the surface around the protrusion, the p-electrode being light-transmissive;
a second light reflecting film disposed on the p-electrode;
an insulating film spaced apart from the upper surface of the protrusion in the plan view and covering at least a portion of the surface around the protrusion of the p-side semiconductor layer, wherein
a height of the protrusion as measured from the surface around the protrusion is smaller than a thickness of the p-electrode,
a p-type impurity concentration of a layer constituting an upper surface of the protrusion is higher than a p-type impurity concentration of the surface around the protrusion,
a planar area of an upper surface of the p-electrode is larger than a planar area of the upper surface of the protrusion, and an outer edge of the upper surface of the p-electrode is located inward of an outer edge of an upper surface of the p-side semiconductor layer in a plan view,
the insulating film is spaced apart from the second light reflecting film in the plan view, and
the insulating film covers at least a part of the upper surface of the p-electrode.

2. The vertical cavity surface emitting laser element according to claim 1, wherein
the protrusion includes a lateral surface extending between the upper surface and the surface around the protrusion, and
an angle of inclination of the lateral surface of the protrusion with respect to the surface around the protrusion is greater than 0 degrees, and equal to or less than 60 degrees.

3. The vertical cavity surface emitting laser element according to claim 1, wherein
the second light reflecting film includes a dielectric layered film, and is disposed on the p-electrode over the protrusion and at least a part of the surface around the protrusion.

4. The vertical cavity surface emitting laser element according to claim 1, wherein
the thickness of the p-electrode is greater than or equal to 5 nm and equal to or less than 100 nm.

5. The vertical cavity surface emitting laser element according to claim 2, wherein
the thickness of the p-electrode is greater than or equal to 5 nm and equal to or less than 100 nm.

6. The vertical cavity surface emitting laser element according to claim 1, wherein
the height of the protrusion is greater than or equal to 1 nm and equal to or less than 30 nm.

7. The vertical cavity surface emitting laser element according to claim 4, wherein
the height of the protrusion is greater than or equal to 1 nm and equal to or less than 30 nm.

8. The vertical cavity surface emitting laser element according to claim 2, wherein
the height of the protrusion is greater than or equal to 1 nm and equal to or less than 30 nm.

9. The vertical cavity surface emitting laser element according to claim 1, further comprising
a p-pad electrode connected to the p-electrode in a region laterally spaced apart from the protrusion.

10. The vertical cavity surface emitting laser element according to claim 5, wherein
the p-pad electrode is spaced apart from the second light reflecting film.

11. The vertical cavity surface emitting laser element according to claim 1, wherein
the first light reflecting film includes a semiconductor multilayer film.

12. The vertical cavity surface emitting laser element according to claim 1, wherein
the p-side semiconductor layer includes a p-side cladding layer, and a p-side contact layer disposed on the p-side cladding layer,
the upper surface of the protrusion is defined by the p-side contact layer, and
the surface around the protrusion is defined by the p-side cladding layer.

13. The vertical cavity surface emitting laser element according to claim 1, further comprising
a heat dissipation substrate facing the second light reflecting film.

14. The vertical cavity surface emitting laser element according to claim 1, wherein
an arithmetic average roughness of the upper surface of the protrusion is in a range of 0.1 nm to 2 nm, and
an arithmetic average roughness of the surface around the protrusion is in a range of 0.1 nm to 2 nm.

15. The vertical cavity surface emitting laser element according to claim 1, wherein
a difference between the thickness of the p-electrode and the height of the protrusion is greater than or equal to 10 nm and equal to or less than 100 nm.

16. The vertical cavity surface emitting laser element according to claim 1, wherein
the thickness of the p-electrode is greater than or equal to 1.25 times and equal to or less than 20 times the height of the protrusion.

17. The vertical cavity surface emitting laser element according to claim 1, wherein the p-type impurity concentration of the upper surface of the protrusion is in a range of $5 \times 10^{19}$ $cm^{-3}$ to $5 \times 10^{21}$ $cm^{-3}$, and the p-type impurity concentration of the surface around the protrusion is in a range of $1 \times 10^{17}$ $cm^{-3}$ to $1 \times 10^{19}$ $cm^{-3}$.

\* \* \* \* \*